March 11, 1958 WOO F. CHOW 2,826,647

TRANSISTOR TETRODE AMPLIFIER A. G. C. SYSTEM

Filed Dec. 26, 1956

INVENTOR:
WOO F. CHOW,
BY Robert J. Steinmeyer
HIS ATTORNEY.

United States Patent Office 2,826,647
Patented Mar. 11, 1958

2,826,647

TRANSISTOR TETRODE AMPLIFIER A. G. C. SYSTEM

Woo F. Chow, Syracuse, N. Y., assignor to General Electric Company, a corporation of New York Application December 26, 1956, Serial No. 630,613
5 Claims. (Cl. 179—171)

Figure 1:
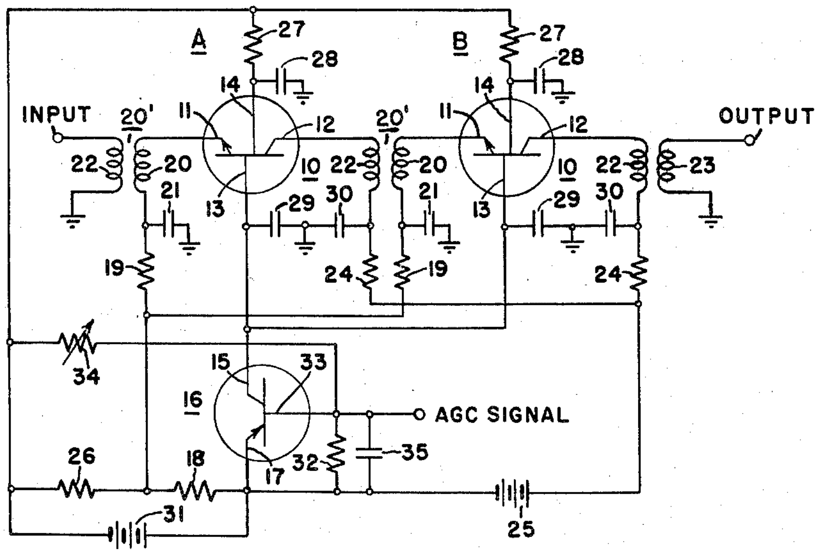

This invention relates to automatic gain control (AGC) systems for transistor circuits and, more particularly, to an automatic gain control system for an amplifier using a transistor tetrode.

The transistor tetrode is a device having a body of semiconducting material with a base zone of one conductivity type disposed between and forming junctions with emitter and collector zones of opposite conductivity type. An emitter electrode is affixed to the emitter zone and a collector electrode to the collector zone. In the base zone a normal base electrode is affixed at one position and an auxiliary base electrode is affixed in a position remote from the normal base electrode, physically on the opposite side of the base zone. The thickness of the base zone is less than that of the emitter and collector zones in order to improve frequency response by reducing transit time. The transistor tetrode is currently available commercially from the General Electric Company, Electronic Components Division, Syracuse, New York, under the type designation ZJ7.

Since the transistor tetrode exhibits improved power gain at higher frequencies, it has been found particularly useful in wide band amplifier circuits. In such circuits utilizing an inductive load which may, for example, be the primary of an interstage coupling transformer or of an output transformer, maximum bandwidth is achieved by eliminating any lumped capacitance in the load circuit. This leaves, however, the output capacitance of the collector electrode of the transistor tetrode, which is effectively in parallel with the load, and any stray capacitances which may be present in lesser degree. Since the load inductance resonates with the output capacitance plus the stray capacitance, it will be seen that the center or resonant frequency of the output circuit of any amplifier stage is dependent upon the value of the tetrode output capacitance of that stage.

When automatic gain control is attempted in the amplifier circuits as above-described, the dependence of the center frequency upon tetrode output capacitance presents problems. Variation of either the emitter current, interbase potential or collector voltage alone results in a shift of output capacitance and a corresponding shift in center frequency and is not satisfactory for automatic gain control in wide band applications where the center frequency must be maintained relatively constant.

Accordingly, it is an object of my invention to provide a transistor tetrode amplifier circuit with automatic gain control while maintaining maximum bandwidth.

Another object of my invention is to minimize variations in the output capacitance of a transistor tetrode amplifier circuit during the application of an AGC signal in order to minimize shift in the center frequency thereof.

A further object of my invention is to provide automatic gain control for a transistor tetrode amplifier circuit, utilizing simple circuitry, to vary the tetrode interbase bias and emitter current selectively and simultaneously in order to minimize shift in the center frequency of the tetrode amplifier.

In carrying out my invention in one particular form thereof, a transistor triode is connected in a common emitter configuration in the base circuit of a transistor tetrode employed in an amplifier. An automatic gain control signal is applied across the base and emitter electrodes of the triode. An increase or decrease in the voltage across the triode emitter and collector simultaneously decreases or increases both the interbase bias voltage and the emitter bias voltage of the tetrode in a selected proportion desired to maintain the tetrode collector output capacitance substantially constant in order to minimize shift in the center frequency of the tetrode amplifier. The effects of these variations on the gain are additive, giving the desired AGC.

Figure 2:
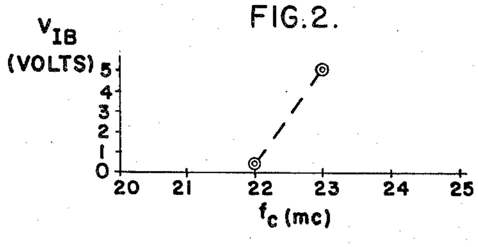
Figure 3:
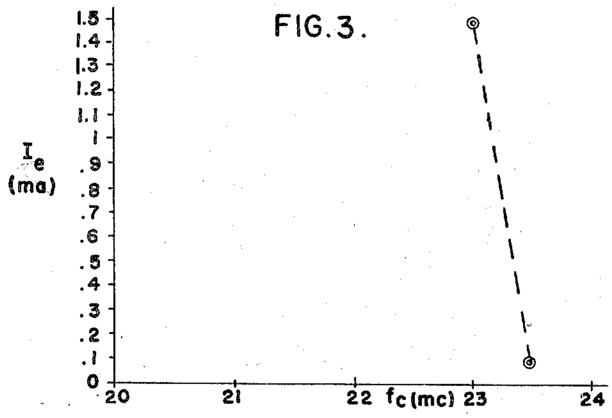

The novel features which I believe to be characteristic of my invention are set forth with particularity in the appended claims. My invention itself, however, together with further objects and advantages thereof, can best be understood by reference to the following description taken in conjunction with the accompanying drawings in which Fig. 1 illustrates a circuit diagram describing one embodiment of my invention; Fig. 2 illustrates the variation in center frequency with interbase potential of the tetrode transistors employed in the circuit of Fig. 1; and Fig. 3 illustrates the variation in center frequency with emitter current of the tetrode transistors of Fig. 1.

Turning now to the drawings, Fig. 1 illustrates a two stage transistor tetrode amplifier having stages A and B each employing a transistor tetrode 10 having an emitter 11, collector 12, normal base 13 and auxiliary base electrode 14. The interelectrode circuits for the transistor tetrodes 10 are similar; hence, like numerals are employed to designate like elements thereof. Each stage employs an emitter, normal base circuit formed by connecting the normal base lead 13 to the collector electrode 15 of a common emitter connected transistor triode 16. The emitter 17 of triode 16 is connected to one end of an impedance shown as a resistor 18. The other end of resistor 18 is connected to one end of an impedance illustrated as a resistor 19. The other end of resistor 19 is connected through the secondary winding 20 of a signal input transformer 20' to the tetrode emitter 11. An R. F. by-pass capacitor 21 is connected from a point between resistor 19 and transformer secondary winding 20 to ground. The signal input transformer secondary winding 20 has coupled thereto a primary winding 22 for introducing or transferring signals from stage to stage.

Each transistor tetrode 10 also has a collector, normal base circuit comprising the collector 12 connected to the transformer primary windings 22 which serve as an input, to transfer the signal from stage to stage, or to feed a load winding 23. Windings 22 are in turn connected to an impedance or resistor 24 which is connected to the positive terminal of a source of D. C. potential 25, the negative terminal of which is connected to triode emitter 17 and thence back to normal base electrode 13 from triode collector 15.

Each transistor tetrode 10 additionally has an interbase circuit which comprises normal base 13 which is connected to an impedance shown as resistor 26 through triode collector electrode 15, triode emitter electrode 17 and resistor 18, respectively. Resistor 26 is in turn connected through an impedance such as resistor 27 to the auxiliary base electrodes 14 of the transistor tetrodes 10. A by-pass capacitor 28 is connected from each auxiliary base electrode 14 to ground. Additional by-pass capacitors 29 are connected from base electrodes 13 to ground, and by-pass capacitors 30 are connected from a point between primary windings 22 and resistors 24 to ground. Interbase and emitter biases are applied to the tetrodes 10 by connecting a second source of D. C. potential 31 across a potential divider consisting of resistors 18 and 26. The source 31 is connected from the normal base to the auxiliary base in the same polarity relationship as the source 25 is connected from the collector to the normal base. The polarities shown here for sources 25 and 31 are for an n-p-n tetrode and would be reversed for a p-n-p tetrode.

Bias is applied to transistor triode 16 by connecting a resistor 32 across the emitter lead 17 and the base lead 33 of triode 16. Variation in bias is achieved by connecting a variable impedance such as resistor 34 from the base lead 33 of triode 16 to a point between resistors 26 and 27. This effectively connects resistors 32 and 34 as a second potential divider across D. C. source 31. A by-pass capacitor 35 is connected across resistor 32 to facilitate application of an AGC signal signal across the emitter 17 and base electrode 33 of triode 16.

Typical values for the above components in one embodiment of our invention are as follows:

Transistor tetrodes 10=General Electric ZJ7's
Transistor triode 16=2N44
Resistor 18=2.2K ohms
Resistor 19=1.8K ohms
Transformer secondary 20=1 microhenry
Capacitor 21=.01 microfarad
Transformer primary 22=5 to 9 microhenries
Resistor 24=360 ohms
D. C. source 25=6 volts
Resistor 26=4.3K ohms
Resistor 27=10K ohms
Capacitor 28=.01 microfarad
Capacitor 29=.01 microfarad
Capacitor 30=.01 microfarad
D. C. source 31=6 volts
Resistor 32=10K ohms
Resistor 34=500K ohms
Capacitor 35=10 microfarads Before detailed explanation of the operation of the circuit described in Fig. 1 is presented, a full understanding of the biases applied to the active circuit elements is essential. As will be observed, transistor tetrodes 10 have a D. C. bias applied across base electrodes 13 and emitter electrodes 11 from resistor 18 that serves as one leg of a voltage divider which includes resistors 18 and 26 and is connected across D. C. source 31. The total bias voltage of source 31 is applied between the normal bases 13 and the auxiliary bases 14. Thus, from the normal bases 13 as a reference, the emitters 11 are biased in one direction and the auxiliary bases 14 are biased further in the same direction. On the other hand, collector electrodes 12 of transistor tetrodes 10 are biased in the opposite direction from the normal base 13 by source of D. C. potential 25.

In order to apply an automatic gain control signal to the transistor tetrodes 10, as biased, either the emitter current, the collector voltage or the interbase bias voltage may be varied. As mentioned above, however, these variations produce substantial changes in the resonant or center frequency of the tetrode amplifier, which is determined by the output capacitances of the transistor tetrodes and any stray capacitances present in conjunction with the apparent inductances of transformers 20'. This may be explained otherwise by considering that if the transistor tetrode output impedance is $Z_o$ and the output admittance $Y_o$, then $$Y_o=\frac{1}{Z_o}=\frac{1}{R_o}+j\omega C_o$$

Accordingly, the bandwidth of the tetrode amplifier is proportional to $$\frac{1}{R_o(C_o+C_s)}$$

where $C_s$ is the stray capacitance, $C_o$ is the output capacitance and $R_o$ is the output resistance. Since a decrease of emitter current alone will decrease $C_o$ it will produce an upward shift of the resonant frequency. A decrease of interbase bias voltage will increase $C_o$ resulting in a downward shift of resonant frequency.

As is illustrated in Fig. 2, a decrease of the interbase bias voltage $V_{IB}$ from 3 to ½ volt changes the center frequency $f_c$ from 23 megacycles to 22 megacycles. A decrease of the emitter current $I_e$ from 1.5 ma. to 100 μa. shifts the center frequency $f_c$ from 23 megacycles to 23.5 megacycles as is illustrated in Fig. 3. It is clear then that AGC can be applied by controlling the emitter current and the interbase voltage simultaneously. This can be done in the correct proportions to substantially cancel upward and downward shifts of center frequency. By proper selection of circuit components the gain correction is proportioned between the emitter and interbase circuits in accordance with the slopes of Figs. 2 and 3 at the average AGC signal level. In the circuit of Fig. 1 this has been accomplished with a resulting minimizing of center frequency shift to the order of several kilocycles which is relatively negligible for a wide band amplifier.

In order to apply the AGC signal to the tetrodes 10 a triode 16 is connected in the base circuit of the tetrodes 10. Resistors 32 and 34 are employed in order to properly bias the triode 16 so that, in the absence of a control signal, the D. C. resistance between the collector electrode 15 and the emitter electrode 17 of triode 16 is not too high. The AGC signal is taken from the output of a second detector (not shown) and is applied to triode 16 across the base electrode 33 and the emitter electrode 17 by applying it across capacitor 35 in such a polarity that an increase in the AGC signal decreases the forward bias current of emitter 17 of the triode 16. Since the tetrodes 10 are n-p-n and their proper auxiliary base bias voltage is negative with respect to the normal base 13, the interbase current flows into the normal base and out of the auxiliary base. Consequently, in order to conform with the proper direction of current flow, a p-n-p triode is selected for triode 16 to amplify the control signal. The AGC polarity is selected so as to be positive at the base 33 of the triode 16 in order to drive it in the proper direction, toward cutoff, to obtain the desired impedance variations. Since the forward bias current of the triode 16 decreases when the control signal increases, triode 16 then presents a high D. C. resistance, and therefore the voltage drop across emitter 17 and collector 15 increases. This increase in emitter-collector voltage drop decreases the interbase bias voltage of tetrodes 10 and, at the same time, decreases the difference between the potential across resistor 18 and that across emitter 17 and collector 15, which comprises the tetrode emitter bias voltage. Consequently, both the tetrode emitter bias current and the interbase bias voltage is decreased by the AGC signal. An AGC signal of ⅗₀ of a volt will provide a decrease of 25 db in gain with the corresponding mentioned small shift in center frequency on the order of kilocycles.

Thus, it has been possible to achieve AGC for a transistor tetrode amplifier in the range around 23 mc. using a relatively small AGC signal to control more than one stage of amplification while at the same time keeping the center frequency of the amplifier substantially constant at a maximized bandwidth.

While I have shown a particular embodiment of my invention, it will be understood, of course, that I do not wish to be limited thereto, since many modifications may be made, and I therefore contemplate by the appended claims to cover any such modifications as fall within the true spirit and scope of my invention.

What I claim as new and desire to secure by Letters Patent of the United States is:

1. A transistor tetrode amplifier with automatic gain control comprising a body of semiconducting material having a base zone of one conductivity type disposed between and forming junctions with an emitter and a collector zone of opposite conductivity type having an emitter electrode and a collector electrode respectively, a normal base electrode connected to one part of said base zone, an auxiliary base electrode connected to another part of said base zone remote from said normal base electrode, a circuit for introducing a signal between said emitter electrode and said normal base electrode, an output circuit connected between said collector and said normal base electrode, said output circuit including a load paralleled only by the output capacitance of said collector electrode, means for biasing said collector in one direction with respect to said normal base, means for biasing said emitter in the other direction with respect to said normal base, means for biasing said auxiliary base electrode in said other direction with respect to said normal base electrode, and means for applying an automatic gain control signal between said emitter electrode and said normal base and between said auxiliary base electrode and the normal base electrode in order to drive the biases therebetween in the same direction whereby the output capacitance of said collector electrode will remain substantially constant to essentially eliminate shift in the center frequency.

2. The system of claim 1 in which said means for applying an automatic gain control signal comprises a second transistor having an emitter, a base and a collector electrode, the emitter and collector of said second transistor being connected in circuit with the normal base portion of said circuit for introducing a signal to said tetrode, and means for applying said automatic gain control signal across the base and emitter of said second transistor, whereby the interbase potential and the emitter bias of said tetrode are simultaneously varied in the same polarity direction in order to minimize change in the output capacitance of said tetrode and corresponding center frequency variations of said amplifier.

3. A transistor tetrode amplifier with automatic gain control comprising a transistor tetrode having an emitter, a collector, a normal base and an auxiliary base electrode; a transistor triode having a collector, an emitter and a base electrode; a normal base, emitter circuit for said tetrode comprising said normal base connected to said triode collector, said triode emitter connected to a first impedance, said first impedance connected to a second impedance, said second impedance connected to a signal input means and said signal input means connected to said tetrode emitter; a collector, normal base circuit for said tetrode comprising said tetrode collector connected to output means, said output means connected to a third impedance, said third impedance connected to a first source of D. C. potential and said first source connected to said triode emitter; an auxiliary base, normal base circuit for said tetrode comprising said auxiliary base connected to a fourth impedance, said fourth impedance connected to a fifth impedance, said fifth impedance connected to said first impedance and said first impedance connected to said triode emitter; means for applying a second D. C. potential across said first and said fifth impedances in series whereby said tetrode emitter is biased from said normal base and said auxiliary base is further biased in the same direction from said normal base, the polarity of said second source from said normal base to said auxiliary base being the same as that of said first source from said tetrode collector to said normal base; a sixth impedance connected across said triode emitter and base, and a seventh impedance connected from said triode base to a point between said fifth impedance and said second source, in order to bias said triode; and means for applying an automatic gain control signal across said triode base and emitter whereby application thereof will drive the tetrode interbase bias and emitter bias in the same direction in order to minimize variation in the output capacitance of said tetrode and the resulting center frequency shift of said amplifier.

4. A transistor tetrode amplifier with automatic gain control comprising a transistor tetrode having an emitter, a collector, a normal base and an auxiliary base electrode; a transistor triode having a collector, an emitter and a base electrode; a normal base, emitter circuit for said tetrode comprising said normal base connected to said triode collector, said triode emitter connected to a first impedance, said first impedance connected to a second impedance, said second impedance connected to a signal input transformer secondary and said signal input transformer secondary connected to said tetrode emitter; a collector, normal base circuit for said tetrode comprising said tetrode collector connected to an output transformer primary, said primary connected to a third impedance, said third impedance connected to a first source of D. C. potential and said first source connected to said triode emitter; an auxiliary base, normal base circuit for said tetrode comprising said auxiliary base connected to a fourth impedance, said fourth impedance connected to a fifth impedance, said fifth impedance connected to said first impedance and said first impedance connected to said triode emitter; means for applying a second D. C. potential across said first and said fifth impedances in series whereby said tetrode emitter is biased from said normal base and said auxiliary base is further biased in the same direction from said normal base, the polarity of said second source from said normal base to said auxiliary base being the same as that of said first source from said tetrode collector to said normal base; a sixth impedance connected across said triode emitter and base, and a seventh impedance connected from said triode base to a point between said fifth impedance and said second source, in order to bias said triode; and a capacitor connected across said triode base and emitter across which an automatic gain control signal may be applied in order to drive the tetrode interbase bias and emitter bias in the same direction for a variation in automatic gain control in order to minimize variation in the output capacitance of said tetrode and resulting center frequency shift.

5. A transistor tetrode amplifier with automatic gain control comprising a transistor tetrode having an emitter, a collector, a normal base and an auxiliary base; circuit means for applying emitter, collector and interbase biases to said tetrode; means for applying an AGC signal to vary said emitter bias and said interbase bias simultaneously in the same polarity direction and in a selected proportion, whereby variation in the tetrode output capacitance is minimized and shift in the center frequency of said amplifier is substantially eliminated.

No references cited.